(12) United States Patent
Tu et al.

(10) Patent No.: US 11,394,401 B2
(45) Date of Patent: *Jul. 19, 2022

(54) METHODS AND SYSTEMS FOR TRANSCODER, FEC AND INTERLEAVER OPTIMIZATION

(71) Applicant: Avago Technologies International Sales Pte. Limited, Singapore (SG)

(72) Inventors: Chungming Tu, Irvine, CA (US); Thomas V. Souvignier, Boulder, CO (US); Ahmad Darabiha, Aliso Viejo, CA (US)

(73) Assignee: AVAGO TECHNOLOGIES INTERNATIONAL SALES PTE. LIMITED, Singapore (SG)

( * ) Notice: Subject to any disclaimer, the term of this patent is extended or adjusted under 35 U.S.C. 154(b) by 0 days.

This patent is subject to a terminal disclaimer.

(21) Appl. No.: 17/167,000

(22) Filed: Feb. 3, 2021

(65) Prior Publication Data

US 2021/0184700 A1  Jun. 17, 2021

Related U.S. Application Data

(63) Continuation of application No. 16/516,161, filed on Jul. 18, 2019, now Pat. No. 10,944,432.

(Continued)

(51) Int. Cl.
*H03M 13/27* (2006.01)
*H03M 13/00* (2006.01)
(Continued)

(52) U.S. Cl.
CPC ... *H03M 13/2792* (2013.01); *H03M 13/1515* (2013.01); *H03M 13/6516* (2013.01); *H04L 1/0071* (2013.01)

(58) Field of Classification Search
CPC ......... H03M 13/2792; H03M 13/1515; H03M 13/6516; H04L 1/0071
See application file for complete search history.

(56) References Cited

U.S. PATENT DOCUMENTS 5,734,962 A  3/1998  Hladik
5,898,710 A  4/1999  Amrany
(Continued)

FOREIGN PATENT DOCUMENTS

CN        101777927        7/2010

OTHER PUBLICATIONS

Tu, "Transcode, FEC & Interleaver Optimization," IEEE Draft, vol. 802.3ch, Sep. 2018, 11 pages.
(Continued)

*Primary Examiner* — Kyle Vallecillo
(74) *Attorney, Agent, or Firm* — BakerHostetler

(57) ABSTRACT

An interleaved encoder includes a number of encoders consisting of L parallel encoders, and a first switch circuit to sequentially couple an input node to an input port of one of the encoders. The input node receives a group of K*L symbols. Each symbol of the group of K*L symbols is received in synch with a respective clock pulse of a group of K*L clock pulses. The first switch circuit is synched with clock pulses of the group of K*L clock pulses, and sequentially couples the input node to an input port of a subsequent one of the encoders in response to each clock pulse of the group of K*L clock pulses.

20 Claims, 8 Drawing Sheets

Related U.S. Application Data

(60) Provisional application No. 62/733,017, filed on Sep. 18, 2018.

(51) Int. Cl.
  *H03M 13/15* (2006.01)
  *H04L 1/00* (2006.01)

(56) References Cited

U.S. PATENT DOCUMENTS

| | | | | |
|---|---|---|---|---|
| 6,088,404 A | * | 7/2000 | Jekal | H03M 13/256 |
| | | | | 375/341 |
| 6,182,260 B1 | | 1/2001 | Kang et al. | |
| 6,658,605 B1 | * | 12/2003 | Yoshida | H03M 7/30 |
| | | | | 714/702 |
| 2005/0180369 A1 | | 8/2005 | Hansen | |
| 2007/0160139 A1 | | 7/2007 | Vasquez | |
| 2009/0044231 A1 | | 2/2009 | Oh | |
| 2009/0129509 A1 | * | 5/2009 | Choi | H04L 1/005 |
| | | | | 375/326 |
| 2015/0222416 A1 | * | 8/2015 | Saito | H04L 7/0054 |
| | | | | 375/362 |

OTHER PUBLICATIONS

Zhang, et al., "Study of Full Parallel RS(31, 27) Encoder for a 3.2 Gbps Serial Transmitter in 0.18 .mu.m CMOS Technology," Cornell University Library, Jun. 2018, 2 pages.

Extended European Search Report from European Patent Application No. 19196966.6, dated Feb. 25, 2020, 11 pages.

* cited by examiner

METHODS AND SYSTEMS FOR TRANSCODER, FEC AND INTERLEAVER OPTIMIZATION

CROSS-REFERENCE TO RELATED APPLICATIONS

This application is a continuation of the U.S. Provisional patent application Ser. No. 16/516,161 filed Jul. 18, 2019 claiming the benefit of priority under 35 U.S.C. § 119 from U.S. Provisional Patent Application 62/733,017 filed Sep. 18, 2018, which are incorporated herein by reference in their entireties.

TECHNICAL FIELD

The present description relates in general to wired communication, and more particularly to, for example, without limitation, methods and systems for optimization of transcoding, forward error correction (FEC) and interleaving.

BACKGROUND

Wired communication systems, such as those used in automotive applications, are subject to both random and burst errors. Burst errors refer to errors that tend to occur next to or near one another in time. When the majority of the errors are burst errors, the Reed-Solomon (RS) forward error correction (FEC) codes are known to be effective in mitigating these errors. An RS FEC code is basically a polynomial code that is implemented by a circuit that can perform polynomial division in a finite field. Typically an RS FEC is denoted as RS (N, K, m), where N, K and m, respectfully, represent a codeword length, a number of data symbols, and a number of bits per symbol. When the error bursts become more extended in time, a longer RS FEC may be needed that increases the complexity of both the encoder and decoder.

The technique of block interleaving can be applied with a shorter (and lower-cost) FEC to achieve the same amount of protection capability against burst errors. The basic principle of interleaving is to combine L shorter FEC codes, where L is called the interleaving depth, and reorder the data symbols, so that each error burst is distributed evenly into the L shorter FEC codes. Therefore each short FEC code only needs to correct 1/L of the number of errored symbols within that burst of errors. However, the traditional block interleaver is known to introduce additional latency during the interleaving process. Further, the traditional block interleaver requires a memory buffer of size (L−1)*N*m bits at the transmitter side. Another issue with the traditional block interleaver is that it requires the RS FEC encoder to operate at the rate of input symbols or higher. For very high data rate communication systems, it usually requires parallel processing of multiple encoders, each running at a slower speed, in order to meet the required throughput.

BRIEF DESCRIPTION OF THE DRAWINGS

Certain features of the subject technology are set forth in the appended claims. However, for purposes of explanation, several embodiments of the subject technology are set forth in the following figures.

DETAILED DESCRIPTION

The detailed description set forth below is intended as a description of various configurations of the subject technology and is not intended to represent the only configurations in which the subject technology may be practiced. The appended drawings are incorporated herein and constitute part of the detailed description, which includes specific details for providing a thorough understanding of the subject technology. However, the subject technology is not limited to the specific details set forth herein and may be practiced without one or more of the specific details. In some instances, structures and components are shown in a block-diagram form in order to avoid obscuring the concepts of the subject technology.

The subject technology is directed to methods and systems for forward error correction (FEC) and interleaver optimization. The subject technology has a number of advantageous features including saving in cost and chip area by omitting the use of a memory buffer, eliminating the interleaver latency, and being suitable for high-data-rate systems.

Figure 1:
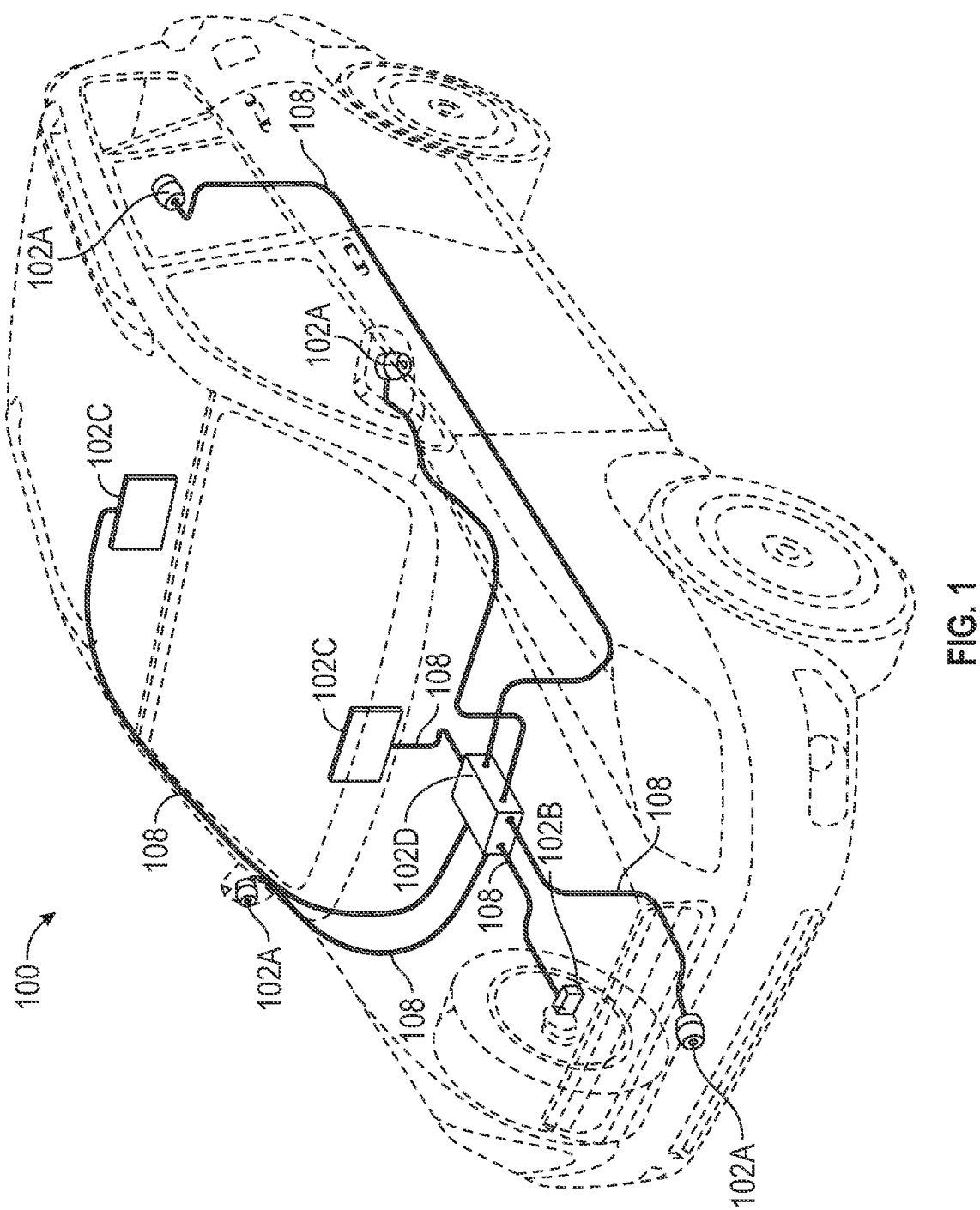
FIG. 1 illustrates an example of an automotive-application network environment in which the subject technology may be implemented.

FIG. 1 illustrates an example of an automotive-application network environment 100 in which the subject technology may be implemented. Not all of the depicted components may be required, however, and one or more implementations may include additional components not shown in the figure. Variations in the arrangement and type of the components may be made without departing from the spirit or scope of the claims as set forth herein. Additional, different or fewer components may be provided.

The automotive-application network environment 100 includes a number of electronic devices 102A-C that are coupled to an electronic device 102D via transmission lines 108. The electronic device 102D may communicably couple the electronic devices 102A-C to one another. In one or more implementations, one or more of the electronic devices 102A-C are communicatively coupled directly to one another, such as without the support of the electronic device 102D. In one or more implementations, one or more of the transmission lines 108 are Ethernet transmission lines, such as one or more twisted pairs of wires. The electronic device 102D may be, or may include, a switch device, a routing device, a hub device, or generally any device that may communicably couple the electronic devices 102A-C.

In one or more implementations, at least a portion of the example network environment 100 is implemented within a vehicle, such as a passenger car. For example, the electronic devices 102A-D may include, and/or may be coupled to, various systems within a vehicle, such as a powertrain system, a chassis system, a telematics system, an entertainment system, a camera system, a sensor system such as a lane departure warning system, a diagnostics system, or generally any system that may be used in a vehicle. In FIG. 1, the electronic devices 102A are depicted as camera devices, such as forward-view, rear-view and side-view cameras; the electronic device 102B is depicted as a sensor; the electronic devices 102C are depicted as entertainment systems; and the electronic device 102D is depicted as a switch device that may include and/or may be coupled to a central on-board diagnostics system. In one or more implementations, one or more of the electronic devices 102A-D may be communicatively coupled to a public communication network, such as the Internet.

The electronic devices 102A-D each implements a physical layer (PHY) that is interoperable with one or more aspects of one or more PHY specifications, such as those described in the Institute of Electrical and Electronics Engineers (IEEE) 802.3 Standards (e.g., 802.3ch). One or more of the electronic devices 102A-D, such as the electronic device 102D, may be configured to operate as a primary (or "master") device, and one or more of the remaining electronic devices 102A-C, such as the electronic device 102A, may be configured to operate as a secondary (or "slave") device. A primary device provides reference clock timing in the system while the secondary devices need to recover the clock frequency from the primary device. For explanatory purposes, the electronic device 102D is primarily described herein as being configured as a primary device, and the electronic device 102A is primarily described herein as being configured as a secondary device. However, one or more of the other electronic devices 102A-C may be configured as the primary device, and the electronic device 102D may be configured as a secondary device.

In operation, a primary electronic device 102D may initiate a link establishment with a secondary electronic device 102A, such as across a single twisted pair of wires, such as a single-pair Ethernet. The electronic devices 102A,D perform a synchronization stage and a training stage to establish the link over single-pair Ethernet, and then the electronic devices 102A,D enter a data mode for data transmissions. In one or more implementations, the primary electronic device 102D may be used for driving controls such as in an autopilot mode of operation of a vehicle and/or data uploads and/or downloads. In some implementations, the primary electronic device 102D may be or may include a processor such as a general processor.

Figure 2:
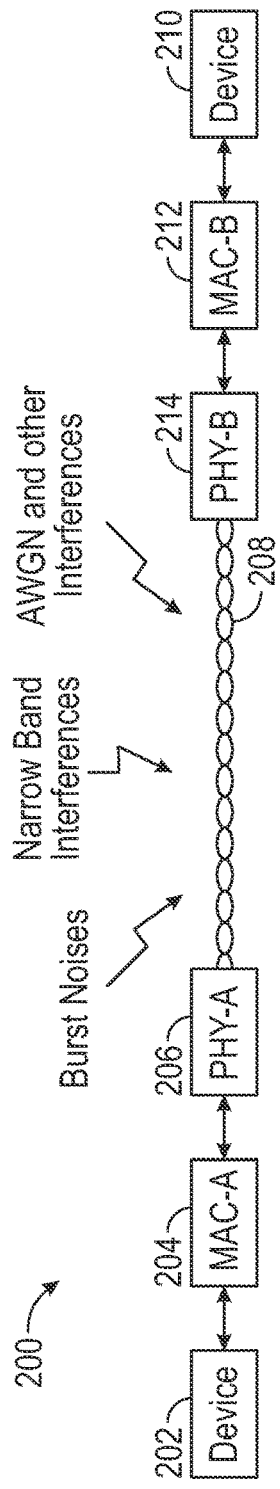
FIG. 2 illustrates an example of a wired communication system susceptible to a variety of noises.

FIG. 2 illustrates an example of a wired communication system 200 susceptible to a variety of noises. The wired communication system 200 includes a first device 202 in a wired communication with a second device 210 via a transmission line 208, such as an Ethernet transmission line consisting of one or more twisted pairs of wires. The first device 202 is coupled to the transmission line 208 through a first media-access control (MAC) module (MAC-A) 204 and a first PHY module (PHY-A) 206. Similarly, the second device 210 is coupled to the transmission line 208 through a second MAC module (MAC-B) 212 and a second PHY module (PHY-B) 214. The transmission line 208 is susceptible to a number of interferences such as burst noise, narrow-band interferences, additive white Gaussian noise (AWGN) and other interferences. A PHY module of the subject technology, as explained herein, can effectively protect against these burst error sources.

Figure 3:
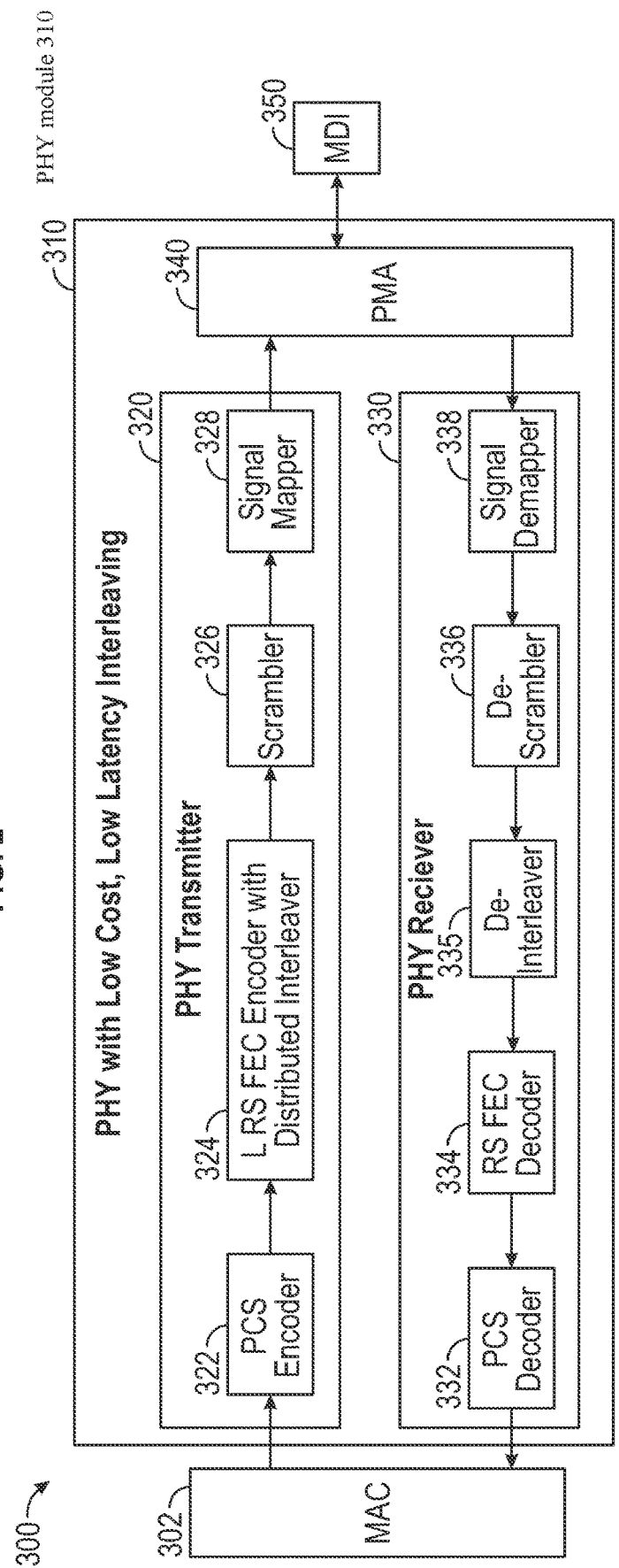
FIG. 3 illustrates a schematic diagram of an example of an electronic device including a low-cost, low-latency interleaving physical layer (PHY) device, in accordance with one or more implementations of the subject technology.

FIG. 3 illustrates a schematic diagram of an example of an electronic device 300 including a low-cost, low-latency interleaving-PHY device 310, in accordance with one or more implementations of the subject technology. Not all of the depicted components may be required, however, and one or more implementations may include additional components not shown in the figure. Variations in the arrangement and type of the components may be made without departing from the spirit or scope of the claims as set forth herein. Additional, different or fewer components may be provided.

The example electronic device 300 includes a MAC module 302, a PHY module 310, and a medium dependent interface (MDI) 350. The PHY module 310 includes a PHY transmitter 320, a PHY receiver 330 and a physical medium attachment (PMA) module 340. In one or more implementations, the PHY transmitter 320 and the PHY receiver 330 may be combined in a single PHY module. The PHY transmitter 320 includes a PCS encoder 322, a Reed-Solomon (RS) encoder with a distributed interleaver (hereinafter, interleaved RS encoder) 324, a scrambler 326 and a signal mapper 328. The PHY receiver 330 includes a PCS decoder 332, an RS FEC decoder 334, a deinterleaver 335, a descrambler 336 and a signal demapper 338. The RS FEC decoder 334 may also be referred to as a forward error correction (FEC) decoder.

The MAC module 302 is communicatively coupled to the PHY module 310 via an interface, such as a 10-gigabit media-independent interface (XGMII), or any other interface, over which data is communicated between the MAC module 302 and the PHY module 310. The PCS encoder 322 performs one or more encoding and/or transcoding functions on data received from the MAC module 302, such as 64B/65B line encoding. The interleaved RS FEC encoder 324 performs RS encoding on the data received from the PCS encoder 322. The interleaved RS encoder 324 is an interleaved RS encoder with a depth L that can run at about 100% throughput. The interleaved RS encoder 324 obviates the use of buffer memory and drastically reduces latency cost, as described in more detail herein.

The scrambler 326 is an additive or synchronous scrambler such that bit errors would not result in descrambler resynchronization, as may be the case for multiplicative scramblers. The scrambler 326 is placed after the interleaved RS encoder 324 and scrambles the RS encoded data by performing an exclusive-OR (XOR) operation on the RS encoded data and using a scrambling sequence. In one or more implementations, the scrambler 326 is always enabled throughout normal data mode, low-power idle (LPI) mode (while the interleaved RS encoder 324 is active), and LPI refresh mode (when the interleaved RS encoder 324 is inactive). In the LPI refresh mode, the reference scrambler sequence can be regenerated for improved performance. The signal mapper 328 maps the scrambled data to symbols, such as by mapping into 4-level pulse amplitude modulation (PAM4) symbols, or generally any bit-to-symbol mapping. The symbols are then passed to the PMA module 340.

In one or more implementations, the PHY module 310 may further include a hybrid circuit (not shown) that is configured to separate the echoes of transmitted signals from the received signals. Any residual echoes may be further removed by digital echo cancellation.

The PMA module 340 performs one or more functions to facilitate uncorrupted data transmission, such as adaptive equalization, echo and/or crosstalk cancellation, automatic gain control (AGC), etc. The MDI 350 provides an interface from the PHY module 310 to the physical medium used to carry the data, for example, a transmission line (e.g., 208 of FIG. 2), to a secondary electronic device (e.g., 210 of FIG. 2).

In a receive path, the PMA module 340 receives symbols transmitted over the transmission lines, for example, from the secondary electronic device, via the MDI 350 and provides the symbols to the signal demapper 338. The signal demapper 338 maps the symbols to scrambled bits, such as by demapping PAM4 symbols. The descrambler 336 descrambles the scrambled bits using scrambler synchronization information received from the secondary electronic device during the training stage. The deinterleaver 335 aggregates and saves L RS FEC codewords of the received symbols and reorders them back to the expected ordering as inputs to the RS FEC decoder 334. The RS FEC decoder 334 performs RS decoding on the descrambled data, and the PCS decoder 332 performs one or more decoding and/or transcoding functions on data received from the RS FEC decoder 334, such as 64B/65B line decoding. The PCS decoder 332 transmits the decoded data to the MAC module 302.

In one or more implementations, one or more of the MAC module 302, the PHY module 310, the PHY transmitter 320, the PCS encoder 322, the interleaved RS encoder 324, the scrambler 326, the signal mapper 328, the PHY receiver 330, the PCS decoder 332, the RS decoder 334, the deinterleaver 335, the descrambler 336, the signal demapper 338, the PMA module 340, the MDI 350 or one or more portions thereof may be implemented in hardware (e.g., an application specific integrated circuit (ASIC), a field programmable gate array (FPGA), a programmable logic device, a controller, a state machine, gated logic, discrete hardware components or any other suitable devices), software (e.g., subroutines and code) and/or a combination of both hardware and software.

Figure 4:
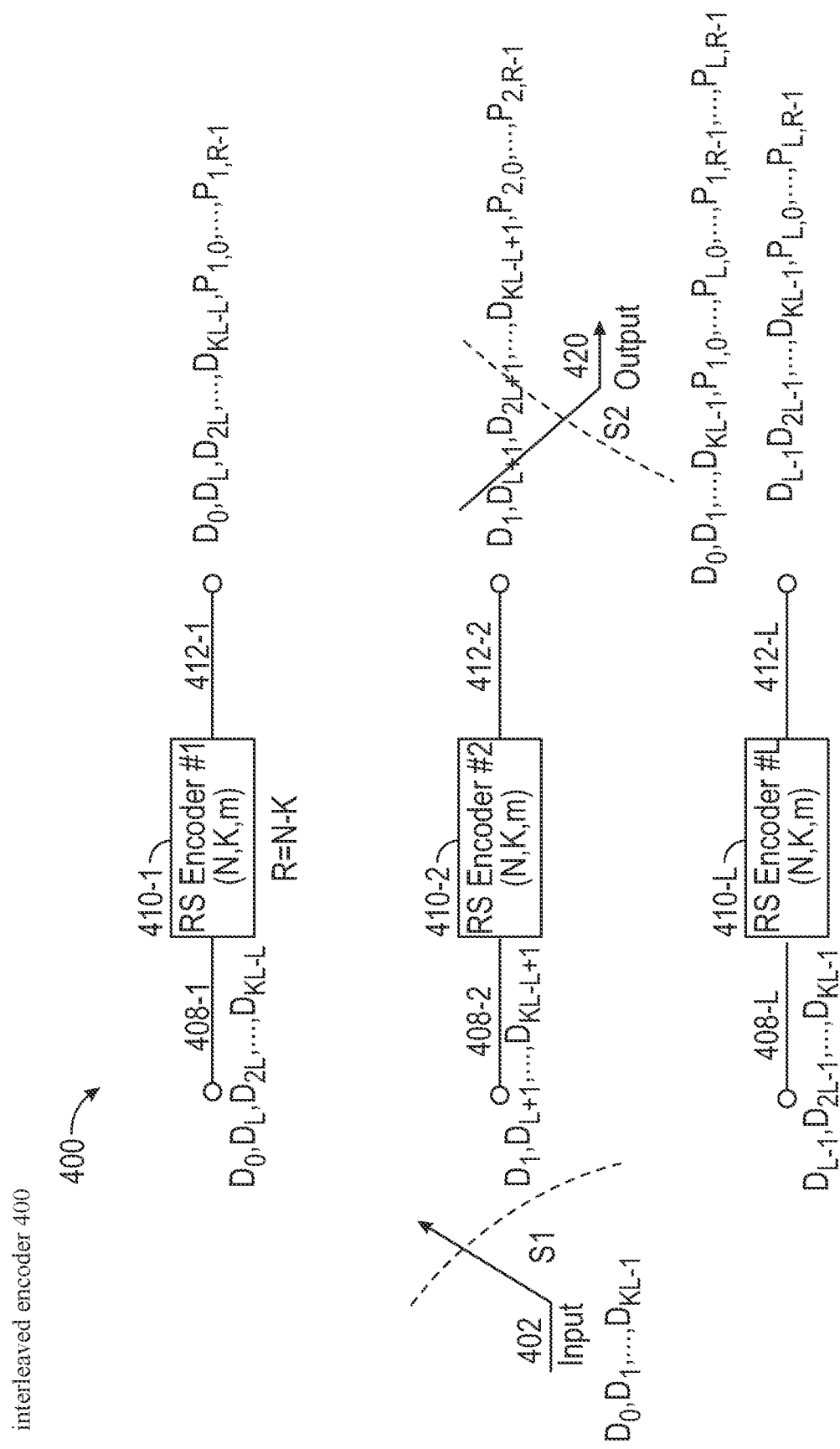
FIG. 4 illustrates a schematic diagram of an example of an interleaved encoder, in accordance with one or more implementations of the subject technology.

FIG. 4 illustrates a schematic diagram of an example of an interleaved encoder 400, in accordance with one or more implementations of the subject technology. The interleaved encoder 400 is an interleaved RS FEC encoder including an input node 402, a first switch circuit (input switch circuit) S1, a number (L) of RS FEC encoders 410 (410-1, 410-2 ... 410-L), a second switch circuit (output switch circuit) S2 and an output node 420. The input node 402 receives a group of symbols including K*L input symbols ($D_0, D_1 \ldots D_{KL-1}$) for encoding. The first switch circuit S1 sequentially couples the input node 402 to an input port 408 (e.g., 408-1, 408-2 ... or 408-L) of one of the RS FEC encoders 410 (e.g., 410-1, 410-2 ... or 410-L). The input symbols are received at the input node 402 in synch with a respective clock pulse of a group of clock pulses. The first switch circuit S1 is also synched with the clock pulses and sequentially couples the input node 402 to an input port 408 of a subsequent encoder 410 in response to each clock pulse. For example, in response to the first group of L clock pulses, the first switch circuit S1 causes the first group of L input symbols $D_0, D_1 \ldots D_{L-1}$ to enter the L RS encoders 410-1, 410-2 ... and 410-L, sequentially. Subsequently, other K-1 groups of input symbols are entered in the L RS FEC encoders 410. For example, in response to the last (e.g., Kth) group of L clock pulses, the last group of input symbols $D_{KL-L}, D_{KL-L+1} \ldots D_{KL-1}$ enters the L RS encoders 410. In other words, the K*L input symbols are entered into the L RS encoders 410 in an interleaved fashion. The RS FEC encoders 410 are RS (N, K, m) encoders, where N, K and m represent a codeword length (in symbols), a number of data symbols associated with the RS encoder 410, and a number of bits per symbol, respectively. In an IEEE 802.3ch compliant 10 gigabits per second RS FEC encoder implementation, L=4, N=360, K=326, and m=10.

The second switch circuit S2 is synchronized with the first switch circuit S1 and sequentially couples an output port 412 (e.g., 412-1, 412-2 ... or 412-L) of a respective one of the RS encoders 410 to an output node 420. The output codes of the RS encoders 410 include the respective input symbols followed by the respective parity symbols. For example, the first output code of the RS encoder 410-1 includes the respective input symbols $D_0, D_L, \ldots D_{KL-L}$ followed by the respective parity symbols $P_{1,0}, P_{1,2} \ldots P_{1,R-1}$ of the RS encoder 410-1. Other RS encoders similarly generate their respective output codes. For example, the Lth output code of the RS encoder 410-L includes the respective input symbols $D_{L-1}, D_{2L-1}, \ldots D_{KL-1}$ followed by the respective parity symbols $P_{L,0}, P_{L,2} \ldots P_{L,R-1}$ of the RS encoder 410-L. The second switch circuit S2 sequentially passes the symbols of the output codes of the RS encoders 410 to the output node 420. For example, in response to the first group of L clock pulses, output symbols $D_0, D_1 \ldots D_{L-1}$ are passed to the output node 420, and in response to the last group of L clock pulses, output parity symbols $P_{1,R-1}, P_{2,R-1} \ldots P_{L,R-1}$ are passed to the output node 420. In other words, the output code of the interleaved encoder 400 includes the K*L input symbols followed by an interleaved parity symbols of the individual RS FEC encoders 410. It is interesting to note that each RS encoder 410 operates at a frequency equal to fc/L, where fc represents a clock frequency of the group of clock pulses. In other words, the RS encoders 410 do not have to operate at the clock frequency and can operate at a much lower (e.g., 1/L such as ¼) frequency compared to the clock frequency. Further, an RS encoder 410 does not need any memory buffer, which results in lower cost and lower latency as compared to traditional interleaved encoders.

In order to obtain a better understanding of the output codes of the RS encoders 410, the structure of an RS FEC encoder is discussed herein with respect to FIG. 5 below.

Figure 5:
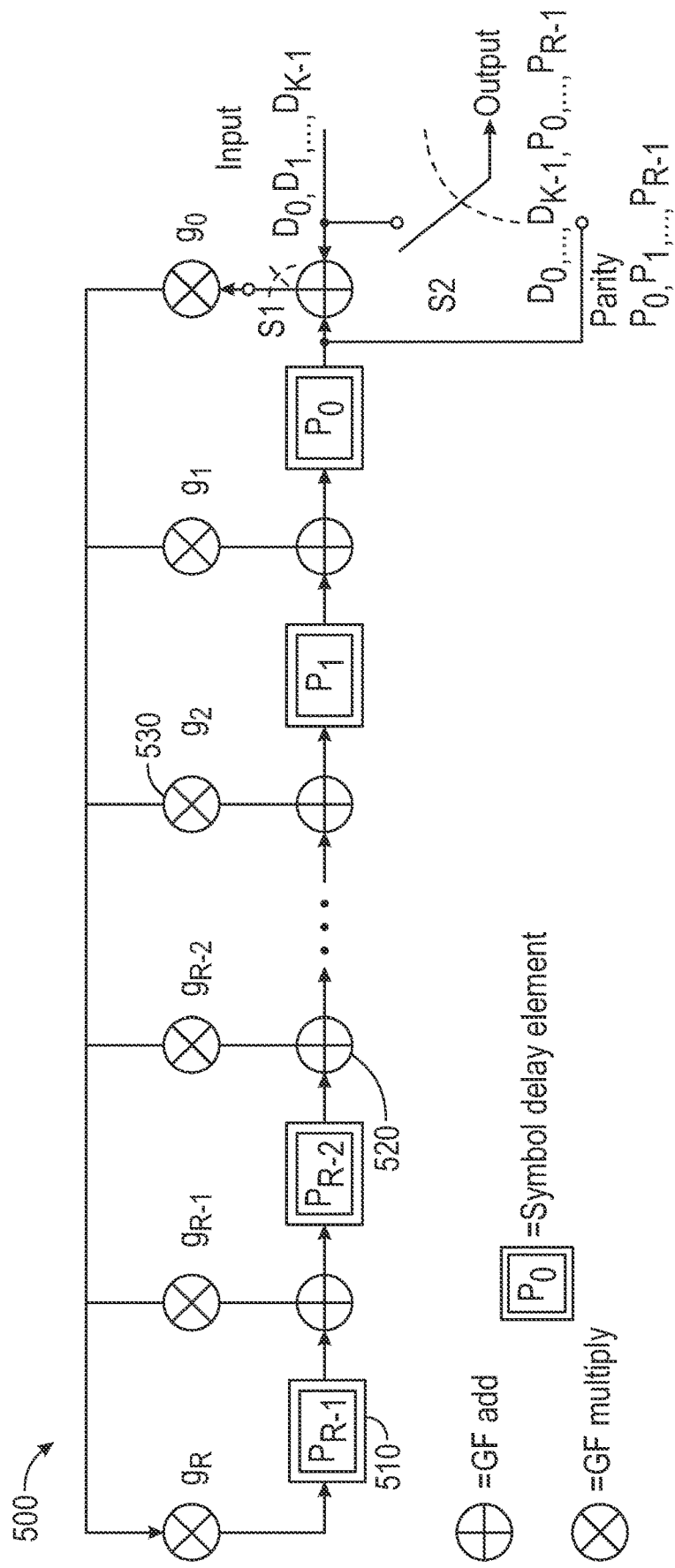
FIG. 5 illustrates an example of a Reed-Solomon (RS) encoder of the interleaved encoder of FIG. 4.

FIG. 5 illustrates an example of an RS FEC encoder 500 of the interleaved encoder 400 of FIG. 4. The RS FEC encoder 500 includes a number of (R) symbol delay elements 510, Galois Field (GF) adders 520, GF multipliers 530 and switches S1 and S2. The switch S1 sequentially enters a number of (K) input symbols $D_0, D_1 \ldots D_{K-1}$ to the GF multipliers 530 and via a switch S2 to an output node of the RS encoder 500. At the GF multipliers 530, each symbol is multiplied by a Galois factor (e.g., $g_1 \ldots g_R$) and is passed to an input of respective GF adder 520, as shown in FIG. 5 to form the R parity symbols $P_0, P_1 \ldots P_{R-1}$, which appear at the output node in order after the encoding has completed.

Figure 6:
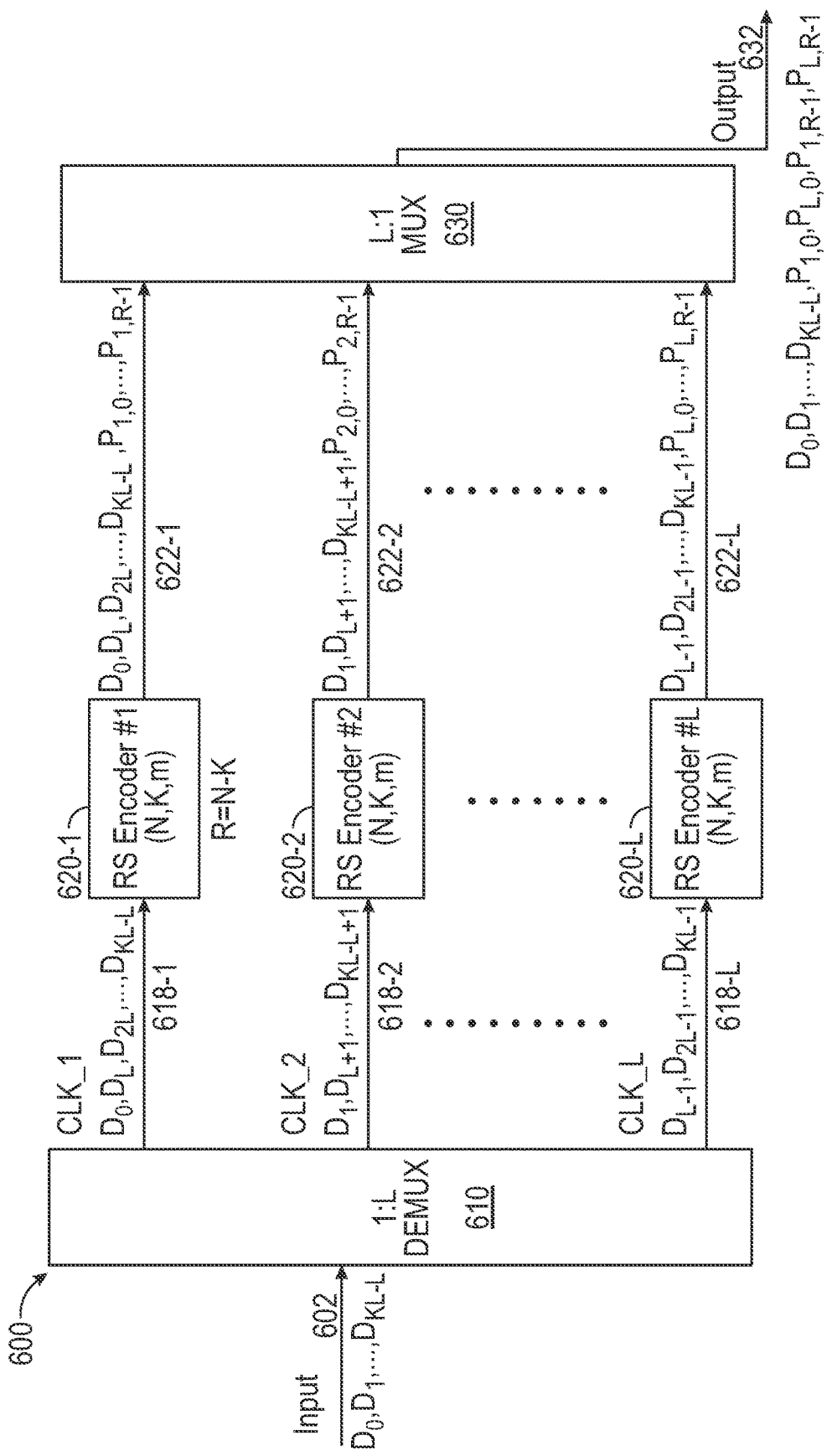
FIG. 6 illustrates a schematic diagram of an example implementation of the interleaved encoder of FIG. 4, in accordance with one or more implementations of the subject technology.

FIG. 6 illustrates a schematic diagram of an example implementation 600 of the interleaved encoder 400 of FIG. 4, in accordance with one or more implementations of the subject technology. In the example implementation 600, switch circuits S1 and S2 of FIG. 4 are implemented by using a demultiplexer (Demux) 610 and a multiplexer (Mux) 630, respectively. The RS encoders 620 (e.g., 620-1, 620-2 ... 620-L) are similar to the RS encoders 410 (e.g., 410-1, 410-2 ... 410-L) of FIG. 4 and perform similar functionalities. The Demux 610 is synched with the input clock pulses and sequentially couple the input node 602 to an input port 618 (e.g., 618-1, 618-2 ... or 618-L) of a subsequent RS encoder 620 in response to each clock pulse.

For example, in response to the first group of L clock pulses, the Demux 610 causes the first group of L input symbols $D_0$, $D_1 \ldots D_{L-1}$ to enter the L RS encoders 620-1, 620-2 ... 620-L, sequentially. Subsequently, other K-1 groups of input symbols are entered in the L RS encoders 620. For example, in response to the last (e.g., Kth) group of L clock pulses, the last group of input symbols $D_{KL-L}, D_{KL-L+1} \ldots D_{KL-1}$ enter the L RS encoders 620. In other words, the K*L input symbols are entered into the L RS encoders 620 in an interleaved fashion.

Similar to the switch circuit S2 of FIG. 4, the Mux 630 is synchronized with the Demux 610 and sequentially couples an output port 622 (e.g., 622-1, 622-2 ... or 622-L) of a subsequent RS encoder 620 to an output node 632. The output codes of the RS encoders 620 include the respective input symbols followed by the respective parity symbols. For example, the first output code of the RS encoder 620-1 includes the respective input symbols $D_0, D_L \ldots D_{KL-L}$ followed by the respective parity symbols $P_{1,0}, P_{1,2} \ldots P_{1,R-1}$ of the RS encoder 620-1. Other RS encoders 620 similarly generate their respective output codes. For example, the Lth output code of the RS encoder 620-L includes the respective input symbols $D_{L-1}, D_{2L-1} \ldots D_{KL-1}$ followed by the respective parity symbols $P_{L,0}, P_{L,1} \ldots P_{L,R-1}$ of the RS encoder 620-L. The Mux 630 sequentially passes the symbols of the output codes of the RS encoders 620 to the output node 632. For example, in response to the first group of L clock pulses, output symbols $D_0, D_1 \ldots D_{L-1}$ are passed to the output node 632, and in response to the last group of L clock pulses, output parity symbols $P_{1,R-1}, P_{2,R-1} \ldots P_{L,R-1}$ are passed to the output node 632. In other words, the output code of the interleaved encoder of the implementation 600 includes the K*L input symbols followed by an interleaved parity symbols of the individual RS FEC encoders 620. As stated with respect to RS FEC encoders 410 of FIG. 4, each RS FEC encoder 620 operates at a frequency equal to fc/L, where fc represents a clock frequency of the group of clock pulses. In other words, the RS FEC encoders 620 do not have to operate at the clock frequency and can operate at much lower (e.g., 1/L such as ¼) frequencies compared to the clock frequency. Further, an RS FEC encoder 620 does not need any memory buffer, which results in lower cost and lower latency as compared to traditional interleaved encoders.

Figure 7:
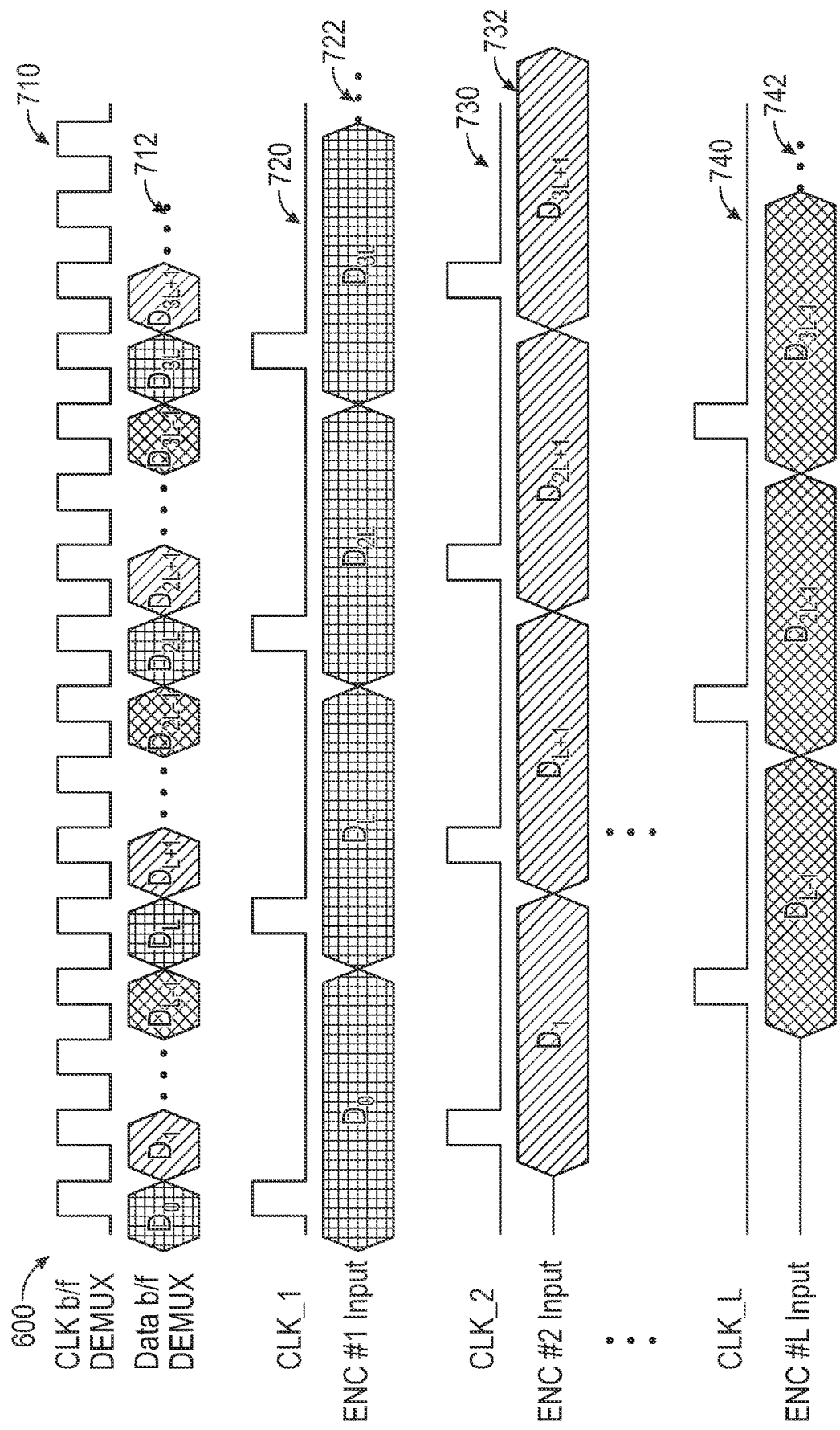
FIG. 7 illustrates a timing diagram including a number of plots of example clock pulses and data sequences, in accordance with one or more implementations of the subject technology.

FIG. 7 illustrates a timing diagram 700 including a number of plots 710, 720, 730 and 740 of example clock pulses and plots 712, 722, 732 and 742 of example data sequences, in accordance with one or more implementations of the subject technology. The plots shown on the diagram 700 are for the example implementation 600 of FIG. 6. For example, plot 710 depicts a group of main clock pulses (CLK), with a clock frequency of fc, that are applied to the Demux 610 of FIG. 6, and the plot 712 shows input symbol data that are sequentially transferred RS encoders 620 of FIG. 6 in synch with the clock pulses CLK. For example, input symbols $D_0, D_1 \ldots D_{L-1}$ are first transferred to RS encoders 620-1, 620-2 ... 620-L, respectively, and subsequently pairing symbols are similarly transferred to the RS encoders 620. Plot 720 shows a first group of clock pulses CLK-1 in synch with the main CLK, but with a frequency equal to fc/L, where L is the depth of the interleaved RS encoders 620 of FIG. 6. The second group of clock pulses CLK-2 of the plot 730 and the Lth group of clock pulses CLK-L of the plot 740 are similarly in sync with the main CLK, have a frequency of fc/L and are subsequently delayed by one clock pulse with respect to one another. The corresponding symbol data at the input ports 618 of the RS encoders 620 are shown in plots 722, 732 and 742.

Figure 8:
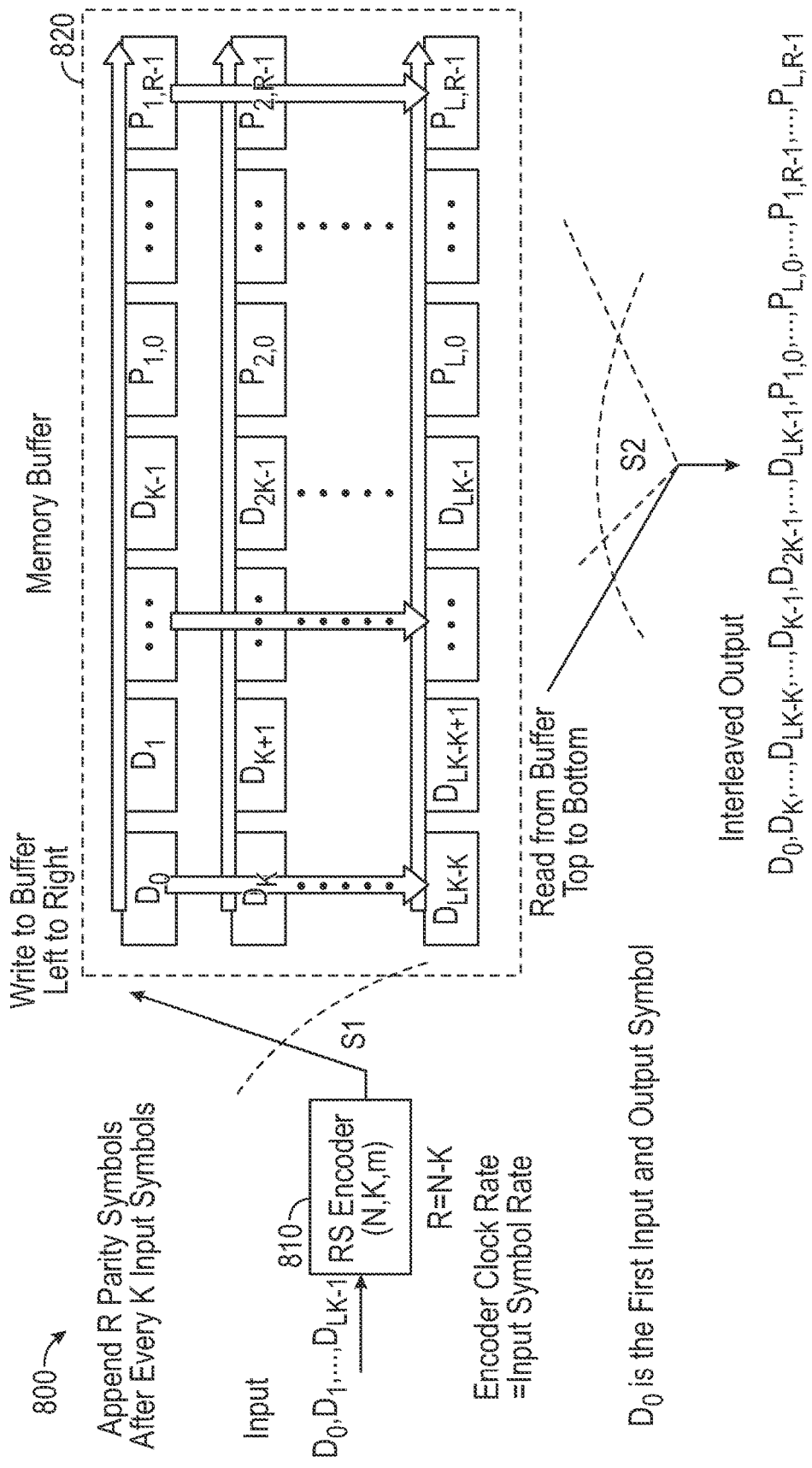
FIG. 8 illustrates a schematic diagram of an example of a traditional block interleaved encoder using buffered memory.

FIG. 8 illustrates a schematic diagram of an example of a traditional interleaved encoder 800 using buffered memory 820. The interleaved encoder 800 is a traditional implementation that requires the buffered memory 820 for its interleaving operation. The interleaved encoder 800 includes an RS FEC encoder 810, a first switch S1, the buffered memory 820 and a second switch S2. The RS FEC encoder 810 is an RS encoder (N,K,m) as described above, for example, with respect to FIG. 7, and receives input symbols ($D_0, D_1 \ldots D_{LK-1}$) at its input port. The clock rate of the RS encoder 810 is equal to the input symbol rate. The RS encoder 810 appends R parity symbols after every K input symbol. The buffered memory 820 includes L rows and N columns.

The first switch S1 sequentially transfers symbols of the output codes of the RS FEC encoder 810 to cells of rows of the buffered memory 820 such that rows 1 to L are filled sequentially. For example, the first row of the buffered memory 820 is first filled with a first group of data symbols and parity symbols ($D_0, D_1 \ldots D_{K-1}, P_{1,0}, P_{1,1} \ldots P_{1,R-1}$), and subsequently the second row is first filled with the second group of data symbols and parity symbols ($D_K, D_{K+1} \ldots D_{2K-1}, P_{2,0}, P_{2,1} \ldots P_{2,R-1}$). Finally, the last row is filled with the Lth group of data symbols and parity symbols ($D_{LK-K}, D_{LK-K+1} \ldots D_{LK-1}, P_{L,0}, P_{L,1} \ldots P_{L,R-1}$).

The data reading from the buffered memory 820 is performed column-by-column by the second switch S2. Reading data starts from the first column and ends with the Nth column, such that the interleaved output code includes data symbols $D_0, D_K, \ldots, D_{LK-K}, \ldots, D_{K-1}, D_{2K-1}, \ldots, D_{LK-1}$ followed by parity symbols $P_{1,0}, \ldots, P_{L,0}, \ldots, P_{1,R-1}, \ldots, P_{L,R-1}$.

The traditional implementation, as represented by the interleaved encoder 800, has a number of disadvantages that are mitigated by the subject technology. For example, the interleaved encoder 800 requires the buffered memory 820 size (L−1)*N*m bits at the transmitter side, where L is the interleaving depth. This adds to chip area and cost of the traditional implementations and further leads to additional latency. Another issue with the traditional block interleaver is that it requires the RS encoder 810 to operate at the rate of input symbols or higher. For very high data rate communication systems, parallel processing of multiple encoders, each running at a slower speed, may be needed in order to meet the required throughput.

Figure 9:
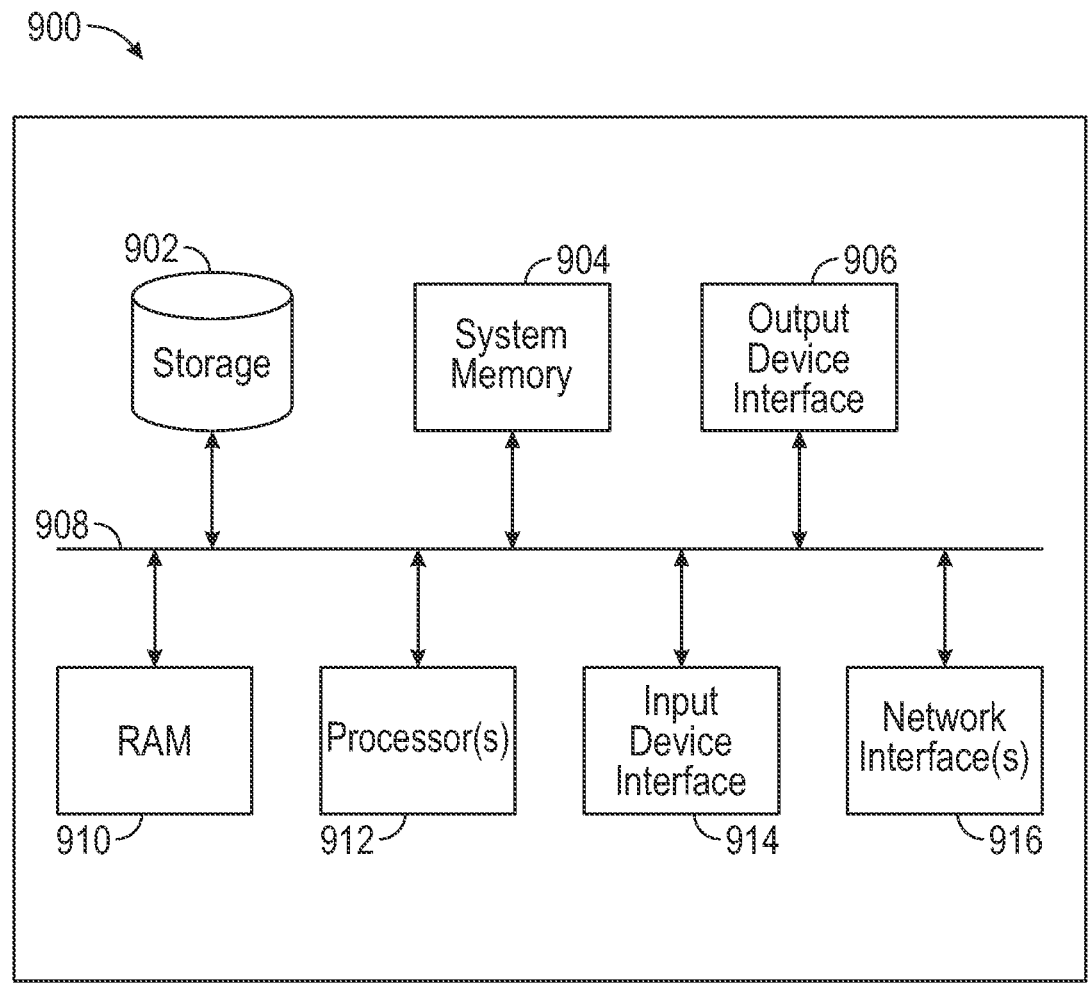
FIG. 9 conceptually illustrates an electronic system with which aspects of the subject technology are implemented.

FIG. 9 conceptually illustrates an electronic system 900 with which aspects of the subject technology are implemented. The electronic system 900, for example, can be a network device, a media converter, a desktop computer, a laptop computer, a tablet computer, a server, a switch, a router, a base station, a receiver, a phone, or generally any electronic device that transmits signals over a network. Such an electronic system 900 includes various types of computer-readable media and interfaces for various other types of computer-readable media. In one or more implementations, the electronic system 900 is, or includes, one or more of the devices 102D of FIG. 1 or may perform some of the functionalities of the RS encoders of the subject technology. The electronic system 900 includes a bus 908, one or more processing units 912, a system memory 904, a read-only memory (ROM) 910, a permanent storage device 902, an input device interface 914, an output device interface 906, and a network interface 916, or subsets and variations thereof.

The bus 908 collectively represents all system, peripheral, and chipset buses that communicatively connect the numerous internal devices of the electronic system 900. In one or more implementations, the bus 908 communicatively connects the one or more processing units 912 with the ROM 910, the system memory 904, and the permanent storage device 902. From these various memory units, the one or more processing units 912 retrieve instructions to execute and data to process in order to execute the processes of the subject disclosure. The one or more processing units 912 can be a single processor or a multi-core processor in different implementations. In one or more implementations, one or more processing units 912 are, or include, one or more of the devices 102D of FIG. 1 or may perform some of the functionalities of the RS encoders of the subject technology.

The ROM 910 stores static data and instructions that are needed by the one or more processing units 912 and other modules of the electronic system. The permanent storage device 902, on the other hand, is a read-and-write memory device. The permanent storage device 902 is a non-volatile memory unit that stores instructions and data even when the electronic system 900 is off. One or more implementations of the subject disclosure use a mass-storage device (such as a magnetic or optical disk and its corresponding disk drive) as the permanent storage device 902.

Other implementations use a removable storage device (such as a floppy disk, flash drive, and its corresponding disk drive) as the permanent storage device 902. Like the permanent storage device 902, the system memory 904 is a read-and-write memory device. However, unlike the permanent storage device 902, the system memory 904 is a volatile read-and-write memory, such as random access memory. System memory 904 stores any of the instructions and data that the one or more processing units 912 need at runtime. In one or more implementations, the processes of the subject disclosure are stored in the system memory 904, the permanent storage device 902, and/or the ROM 910. From these various memory units, the one or more processing units 912 retrieve instructions to execute and data to process in order to execute the processes of one or more implementations.

The bus 908 also connects to the input device interface 914 and the output device interface 906. The input device interface 914 enables a user to communicate information and select commands to the electronic system 900. Input devices used with the input device interface 914 include, for example, alphanumeric keyboards and pointing devices (also called "cursor control devices"). The output device interface 906 enables, for example, the display of images generated by the electronic system 900. Output devices used with the output device interface 906 include, for example, printers and display devices, such as a liquid crystal display (LCD), a light emitting diode (LED) display, an organic light emitting diode (OLED) display, a flexible display, a flat panel display, a solid state display, a projector, or any other device for outputting information. One or more implementations include devices that function as both input and output devices, such as a touchscreen. In these implementations, feedback provided to the user can be any form of sensory feedback, such as visual feedback, auditory feedback, or tactile feedback; and input from the user can be received in any form, including acoustic, speech, or tactile input.

Finally, as shown in FIG. 9, the bus 908 also couples the electronic system 900 to one or more networks (not shown) through one or more network interfaces 916. In this manner, the computer can be a part of one or more network of computers (such as a local area network ("LAN"), a wide area network ("WAN"), an Intranet, or a network of networks, such as the Internet. Any or all components of the electronic system 900 can be used in conjunction with the subject disclosure.

Implementations within the scope of the present disclosure can be partially or entirely realized using a tangible computer-readable storage medium (or multiple tangible computer-readable storage media of one or more types) encoding one or more instructions. The tangible computer-readable storage medium can also be non-transitory in nature.

The computer-readable storage medium can be any storage medium that can be read, written, or otherwise accessed by a general purpose or special purpose computing device, including any processing electronics and/or processing circuitry capable of executing instructions. For example, without limitation, the computer-readable medium can include any volatile semiconductor memory, such as RAM, DRAM, SRAM, T-RAM, Z-RAM, and TTRAM. The computer-readable medium also can include any nonvolatile semiconductor memory, such as ROM, PROM, EPROM, EEPROM, NVRAM, flash, nvSRAM, FeRAM, FeTRAM, MRAM, PRAM, CBRAM, SONOS, RRAM, NRAM, racetrack memory, FJG, and Millipede memory.

Further, the computer-readable storage medium can include any nonsemiconductor memory, such as optical disk storage, magnetic disk storage, magnetic tape, other magnetic storage devices, or any other medium capable of storing one or more instructions. In some implementations, the tangible computer-readable storage medium can be directly coupled to a computing device, while in other implementations the tangible computer-readable storage medium can be indirectly coupled to a computing device, e.g., via one or more wired connections, one or more wireless connections, or any combination thereof.

Instructions can be directly executable or can be used to develop executable instructions. For example, instructions can be realized as executable or non-executable machine code or as instructions in a high-level language that can be compiled to produce executable or nonexecutable machine code. Further, instructions also can be realized as or can include data. Computer-executable instructions also can be organized in any format, including routines, subroutines, programs, data structures, objects, modules, applications, applets, functions, etc. As recognized by those of skill in the art, details including, but not limited to, the number, structure, sequence, and organization of instructions can differ significantly without varying the underlying logic, function, processing, and output.

While the above discussion primarily refers to microprocessor or multi-core processors that execute software, one or more implementations are performed by one or more integrated circuits, such as application specific integrated circuits (ASICs) or field programmable gate arrays (FPGAs). In one or more implementations, such integrated circuits execute instructions that are stored on the circuits themselves.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but are to be accorded the full scope consistent with the language claims, wherein reference to an element in the singular is not intended to mean "one and only one" unless specifically so stated, but rather "one or more." Unless specifically stated otherwise, the term "some" refers to one or more. Pronouns in the masculine (e.g., his) include the feminine and neuter gender (e.g., her and its) and vice versa. Headings and subheadings, if any, are used for convenience only and do not limit the subject disclosure.

The predicate words "configured to," "operable to," and "programmed to" do not imply any particular tangible or intangible modification of a subject, but rather are intended to be used interchangeably. For example, a processor configured to monitor and control an operation or a component may also mean the processor being programmed to monitor and control the operation or the processor being operable to monitor and control the operation. Likewise, a processor configured to execute code can be construed as a processor programmed to execute code or operable to execute code.

A phrase such as an "aspect" does not imply that such aspect is essential to the subject technology or that such aspect applies to all configurations of the subject technology. A disclosure relating to an aspect may apply to all configurations, or one or more configurations. A phrase such as an aspect may refer to one or more aspects and vice versa. A phrase such as a "configuration" does not imply that such configuration is essential to the subject technology or that such configuration applies to all configurations of the subject technology. A disclosure relating to a configuration may apply to all configurations, or one or more configurations. A phrase such as a configuration may refer to one or more configurations and vice versa.

The word "example" is used herein to mean "serving as an example or illustration." Any aspect or design described herein as "example" is not necessarily to be construed as preferred or advantageous over other aspects or designs.

All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112, sixth paragraph, unless the element is expressly recited using the phrase "means for" or, in the case of a method claim, the element is recited using the phrase "step for." Furthermore, to the extent that the term "include," "have," or the like is used in the description or the claims, such term is intended to be inclusive in a manner similar to the term "comprise" as "comprise" is interpreted when employed as a transitional word in a claim.

Those of skill in the art would appreciate that the various illustrative blocks, modules, elements, components, methods, and algorithms described herein may be implemented as electronic hardware, computer software, or combinations of both. To illustrate this interchangeability of hardware and software, various illustrative blocks, modules, elements, components, methods, and algorithms have been described above generally in terms of their functionality. Whether such functionality is implemented as hardware or software depends upon the particular application and design constraints imposed on the overall system. Skilled artisans may implement the described functionality in varying ways for each particular application. Various components and blocks may be arranged differently (e.g., arranged in a different order, or partitioned in a different way), all without departing from the scope of the subject technology.

The predicate words "configured to," "operable to," and "programmed to" do not imply any particular tangible or intangible modification of a subject, but rather are intended to be used interchangeably. For example, a processor configured to monitor and control an operation or a component may also mean the processor being programmed to monitor and control the operation or the processor being operable to monitor and control the operation. Likewise, a processor configured to execute code can be construed as a processor programmed to execute code or operable to execute code.

What is claimed is:

1. An interleaved encoder comprising:
a plurality of encoders including L parallel encoders; and
a first switch circuit configured to sequentially couple an input node to an input port of one of the plurality of encoders,
wherein:
the input node is configured to receive a group of K*L symbols,
each symbol of the group of K*L symbols is received in synch with a respective clock pulse of a group of K*L clock pulses, and
each encoder of the plurality of encoders is configured to receive K interleaved symbols of the group of K*L symbols and produce an output code having K+R symbols including K interleaved symbols of the group of K*L symbols.

2. The interleaved encoder of claim 1, wherein the first switch circuit is synched with clock pulses of the group of K*L clock pulses, and is configured to sequentially couple the input node to an input port of a subsequent one of the plurality of encoders in response to each clock pulse of the group of K*L clock pulses.

3. The interleaved encoder of claim 1, wherein the plurality of encoders include L Reed-Solomon (RS) FEC encoders, each RS FEC encoder being an RS (N, K, m) encoder, wherein N, K and m represent a codeword length, a number of data symbols associated with the RS FEC encoder, and a number of bits per symbol, respectively.

4. The interleaved encoder of claim 3, wherein for an IEEE 802.3ch 10 G encoder, L=4, N=360, K=326, and m=10.

5. The interleaved encoder of claim 2, wherein the K interleaved symbols of the group of K*L symbols are followed by a plurality of parity symbols, wherein R represents a count of the plurality of parity symbols.

6. The interleaved encoder of claim 1, further comprising a second switch circuit synchronized with the first switch circuit and configured to sequentially couple an output port of a respective one of the plurality of encoders to an output node.

7. The interleaved encoder of claim 6, wherein the output node is configured to sequentially receive symbols of output codes of the plurality of encoders to produce an interleaved output code.

8. The interleaved encoder of claim 7, wherein the interleaved output code includes the group of K*L symbols followed by an interleaved sum of a plurality of parity symbols of the plurality of encoders.

9. The interleaved encoder of claim 1, wherein a frequency of operation of each encoder of the plurality of encoders is equal to fc/L, wherein fc represents a clock frequency of the group of K*L clock pulses.

10. A system comprising:
an input node disposed to receive a group of symbols;
a plurality of encoders disposed in parallel and configured to receive K interleaved symbols and produce an output code having K+R symbols including K interleaved symbols;

an input switch circuit configured to sequentially couple an input port of one of the plurality of encoders to the input node; and an output switch circuit in synch with the input switch circuit and configured to sequentially couple an output port of a respective one of the plurality of encoders to an output node in synch with clock pulses of a group of clock pulses.

11. The system of claim 10, wherein each symbol of the group of symbols is received in synch with a respective clock pulse of a group of clock pulses, and the input switch circuit is synched with clock pulses of the group of clock pulses.

12. The system of claim 11, wherein the plurality of encoders include L RS FEC encoders, the group of symbols includes K*L symbols and the group of clock pulses includes K*L clock pulses, and wherein each RS FEC encoder is an RS (N, K, m) encoder, wherein for a IEEE 802.3ch 10 G encoder, L=4, N=360, K=326, and m=10.

13. The system of claim 12, wherein each encoder of the plurality of encoders is configured to produce an output code, wherein the output code includes K+R symbols including K interleaved symbols of the group of symbols followed by a plurality of parity symbols, wherein R represents a count of the plurality of parity symbols.

14. The system of claim 13, wherein the output node is disposed to provide an interleaved output code and is configured to sequentially receive symbols of output codes of the plurality of RS FEC encoders to produce the interleaved output code.

15. The system of claim 14, wherein the interleaved output code includes the group of symbols followed by an interleaved sum of a plurality of parity symbols of the plurality of encoders.

16. The system of claim 10, wherein each encoder of the plurality of encoders is configured to operate at a frequency equal to fc/L, wherein fc represents a clock frequency of the group of clock pulses.

17. An electronic device comprising:
an interleaved encoder configured to generate an interleaved output code, the interleaved encoder comprising:
an input node configured to receive a group of symbols in synch with clock pulses of a group of clock pulses;
a plurality of RS encoders disposed in parallel and configured to receive K interleaved symbols and produce an output code having K+R symbols including K interleaved symbols; and
a first switch circuit configured to sequentially couple the input node to an input port of one of the plurality of RS encoders,
wherein:
the first switch circuit is configured to sequentially couple the input node to an input port of a subsequent one of the plurality of RS encoders.

18. The electronic device of claim 17, wherein the plurality of RS encoders include L RS FEC encoders, the group of symbols includes K*L symbols and the group of clock pulses includes K*L clock pulses, and wherein each RS FEC encoder is an RS (N, K, m) encoder, wherein for an IEEE 802.3ch 10 G encoder, L=4, N=360, K=326, and m=10.

19. The electronic device of claim 17, further comprising a second switch circuit synchronized with the first switch circuit and configured to sequentially couple an output port of a respective one of the plurality of RS encoders to an output node.

20. The electronic device of claim 17, the first switch circuit is configured to sequentially couple the input node to the input port of the subsequent one of the plurality of RS encoders in synch with the clock pulses of the group of clock pulses, and wherein the interleaved output code includes the group of symbols followed by an interleaved sum of a plurality of parity symbols of the plurality of RS encoders.

* * * * *